United States Patent
Shiokawa

(10) Patent No.: US 10,998,876 B2
(45) Date of Patent: May 4, 2021

(54) BALUN

(71) Applicant: Murata Manufacturing Co., Ltd., Nagaokakyo (JP)

(72) Inventor: Noboru Shiokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/715,785

(22) Filed: Dec. 16, 2019

(65) Prior Publication Data

US 2020/0119709 A1 Apr. 16, 2020

Related U.S. Application Data

(63) Continuation of application No. PCT/JP2018/019621, filed on May 22, 2018.

(30) Foreign Application Priority Data

Jun. 30, 2017 (JP) .............................. JP2017-129369

(51) Int. Cl.
  *H03H 7/42* (2006.01)
  *H03H 7/09* (2006.01)
  *H03H 7/01* (2006.01)
  *H03H 1/00* (2006.01)

(52) U.S. Cl.
  CPC ............ *H03H 7/42* (2013.01); *H03H 7/0115* (2013.01); *H03H 7/09* (2013.01); *H03H 2001/0085* (2013.01)

(58) Field of Classification Search
  CPC ......... H03H 2001/0085; H03H 7/0115; H03H 7/09; H03H 7/42

USPC ................................... 333/175, 185
See application file for complete search history.

(56) References Cited

U.S. PATENT DOCUMENTS

| | | | | |
|---|---|---|---|---|
| 3,395,327 | A | * | 7/1968 | Kaiser ....................... H02J 3/36 363/35 |
| 8,018,297 | B2 | * | 9/2011 | Aoki ....................... H03H 7/422 333/25 |
| 2009/0243749 | A1 | * | 10/2009 | Rofougaran .............. H01P 5/10 333/25 |

(Continued)

FOREIGN PATENT DOCUMENTS

| | | |
|---|---|---|
| JP | 2007-110271 A | 4/2007 |
| JP | 2010-021928 A | 1/2010 |
| JP | 2011-124880 A | 6/2011 |

OTHER PUBLICATIONS

Official Communication issued in International Patent Application No. PCT/JP2018/019621 dated Aug. 7, 2018.

*Primary Examiner* — Rakesh B Patel
(74) *Attorney, Agent, or Firm* — Keating & Bennett, LLP

(57) ABSTRACT

A balun includes first, second, and third terminals, first, second, and third inductors, and a capacitor. The first and second inductors are electrically connected in series with each other between the first terminal and a ground point. The capacitor is electrically connected in series with the first inductor between the first terminal and the ground point. The capacitor is electrically connected in parallel with the second inductor between the first inductor and the ground point. The third inductor is electrically connected between the second terminal and the third terminal. The third inductor is magnetically coupled with at least the first inductor.

18 Claims, 4 Drawing Sheets

(56) References Cited

U.S. PATENT DOCUMENTS

2010/0007430 A1  1/2010  Aoki
2011/0140806 A1  6/2011  Taniguchi

* cited by examiner

BALUN

CROSS REFERENCE TO RELATED APPLICATIONS

This application claims the benefit of priority to Japanese Patent Application No. 2017-129369 filed on Jun. 30, 2017 and is a Continuation Application of PCT Application No. PCT/JP2018/019621 filed on May 22, 2018. The entire contents of each application are hereby incorporated herein by reference.

BACKGROUND OF THE INVENTION

1. Field of the Invention

The present invention relates to a balun that performs conversion between an unbalanced signal and balanced signals.

2. Description of the Related Art

In a radio frequency (RF) circuit of a communication device and circuits peripheral thereto, a balun that performs conversion between an unbalanced signal and balanced signals may be used in order to reduce the effect of external noise. Japanese Unexamined Patent Application Publication No. 2011-124880 discloses a multilayer balance filter as an example of a balun that performs conversion between an unbalanced signal and balanced signals.

In the multilayer balance filter disclosed in Japanese Unexamined Patent Application Publication No. 2011-124880, conversion is performed between an unbalanced signal and balanced signals as a result of an inductor that is on an unbalanced side and an inductor that is on a balanced side being magnetically coupled with each other. In the multilayer balance filter disclosed in Japanese Unexamined Patent Application Publication No. 2011-124880, an inductor, which forms a low pass filter together with a capacitor, is arranged on the balanced side in addition to the inductor that is used for magnetic coupling.

As in the multilayer balance filter disclosed in Japanese Unexamined Patent Application Publication No. 2011-124880, in the case where an inductor of a low pass filter is arranged in addition to the inductors that provide magnetic coupling necessary for signal transmission, a signal of the pass band is undesirably attenuated when passing through the inductor of the low pass filter. Therefore, insertion loss in the pass band of the balun is degraded by the inductor of the low pass filter.

SUMMARY OF THE INVENTION

Preferred embodiments of the present invention significantly improve the insertion loss of a balun that is provided with a low pass filter.

A balun according to a preferred embodiment of the present invention includes first to third terminals, first to third inductors, and a first capacitor. The first terminal is an unbalanced signal terminal. The second and third terminals are balanced signal terminals. The first and second inductors are electrically connected in series with each other between the first terminal and a ground point. The first capacitor is electrically connected in series with the first inductor between the first terminal and the ground point. The first capacitor is electrically connected in parallel with the second inductor between the first inductor and the ground point. The third inductor is electrically connected between the second terminal and the third terminal. The third inductor is magnetically coupled with at least the first inductor.

The term "balanced signals" refers to two signals having substantially identical maximum amplitude values and for which there is a different of 180° between the phases thereof. The term "an unbalanced signal" refers to a signal having an amplitude based on the ground potential. In addition, the term "magnetic coupling" refers to coupling that occurs via magnetic flux between two inductors in which the magnetic flux between the inductors changes as the current that flows through one inductor changes and in which an induced electromotive force is generated in the other inductor.

In a balun according to a preferred embodiment of the present invention, the first inductor, which receives an unbalanced signal, is magnetically coupled with the third inductor, which receives balanced signals. In addition, since the first inductor is electrically connected in series with the first capacitor between the first terminal and the ground point, the first inductor defines a low pass filter together with the first capacitor. The first inductor defines and functions as both a magnetic coupling inductor and an inductor of a low pass filter. In the balun according to preferred embodiments of the present invention, there is no need to add an inductor for a low pass filter.

According to the baluns of preferred embodiments of the present invention, insertion loss can be significantly improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described in detail with reference to the drawings. In the figures, the same or corresponding portions are denoted by the same symbols and repeated description thereof is generally omitted.

Figure 1:
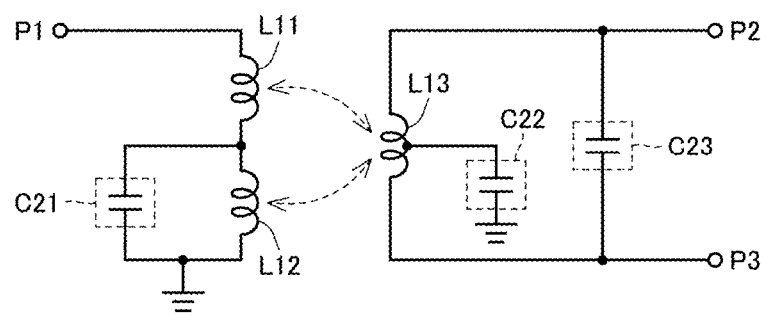
FIG. 1 is an equivalent circuit diagram of a balun according to a preferred embodiment of the present invention.

FIG. 1 is an equivalent circuit diagram of a balun 100 according to a preferred embodiment of the present invention. As shown in FIG. 1, the balun 100 includes terminals P1 to P3, inductors L11 to L13, and capacitors C21 to C23.

The terminal P1 is an unbalanced signal terminal. The terminal P1 is electrically connected to an antenna, which is not shown, for example. The terminals P2 and P3 are balanced signal terminals. The terminals P2 and P3 are electrically connected to an RF circuit, which is not shown, for example. The difference between the phase of a signal output from the terminal P2 and the phase of a signal output from the terminal P3 is 180°. The difference between the phase of a signal input to the terminal P2 and the phase of a signal input to the terminal P3 is 180°.

The inductors L11 and L12 are electrically connected in series with each other between the terminal P1 and a ground point. The capacitor C21 is electrically connected in series with the inductor L11 between the terminal P1 and the ground point. The capacitor C21 is electrically connected in parallel with the inductor L12 between the inductor L11 and the ground point. The inductor L12 and the capacitor C21 define an LC parallel resonator. The resonant frequency of the LC parallel resonator is a frequency f91. The inductor L11 and the capacitor C21 define a low pass filter.

The inductor L13 is electrically connected between the terminals P2 and P3. The inductor L13 is magnetically coupled with the inductors L11 and L12. The capacitor C22 is electrically connected between a portion located between the two ends of the inductor L13, and a ground point. The capacitor C23 is electrically connected in parallel with the inductor L13 between the terminals P2 and P3. The inductor L13 and the capacitor C23 define an LC parallel resonator. The resonant frequency of the LC resonator is a frequency f92. The frequency f92 is equal or substantially equal to the frequency f91.

The balun 100 is a matched filter that is configured so that the pass band thereof includes the resonant frequencies f91 and f92. An unbalanced signal of the pass band that is input to the terminal P1 is transmitted to the inductor L13 via magnetic coupling from the inductors L11 and L12. The phase difference between signals output from the two ends of the inductor L13 is 180°. Balanced signals of the pass band are output from the terminals P2 and P3.

Balanced signals of the pass band input to the terminals P2 and P3 are input to the two ends of the inductor L13 and are transmitted from the inductor L13 to the inductors L11 and L12 via magnetic coupling as an unbalanced signal. The unbalanced signal is output from the terminal P1.

A harmonic wave of a signal of the pass band may be generated from an antenna, which is not shown, that is electrically connected to the terminal P1 or from an RF circuit, which is not shown, that is electrically connected to the terminals P2 and P3. A harmonic wave of a signal is a signal having a frequency that is an integer multiple of the frequency of the signal.

A low pass filter including an inductor is provided in order to reduce a harmonic wave of the signal of the pass band. In the case where a low pass filter is provided that includes an inductor in addition to the magnetically coupled inductors L11 to L13, the signal of the pass band may be attenuated when the signal passes through the inductor of the low pass filter. When a low pass filter is added in order to reduce a harmonic wave, insertion loss in the pass band of the balun 100 may be degraded.

In the balun 100, in addition to the inductor L11 being magnetically coupled with the inductor L13, the inductor L11 also defines the low pass filter together with the capacitor C21. According to the balun 100, since there is no need to add another inductor to define the low pass filter, the insertion loss in the pass band can be maintained while reducing or preventing a harmonic wave of the pass band.

Figure 2:
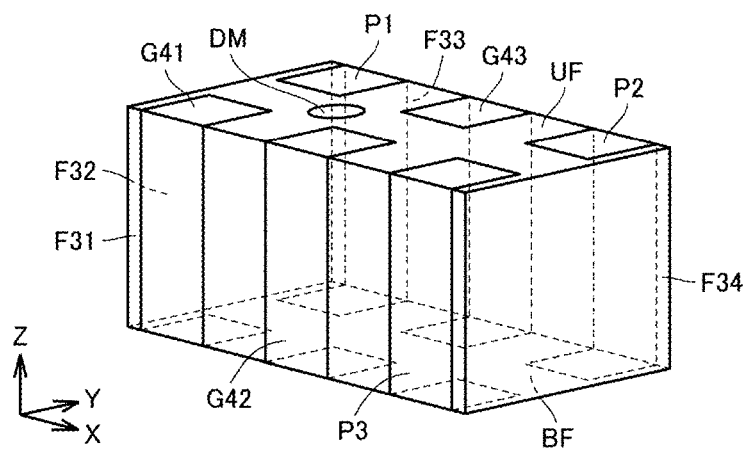
FIG. 2 is an external perspective view of the balun in FIG. 1.

FIG. 2 is an external perspective view of the balun 100 in FIG. 1. As shown in FIG. 2, the balun 100 has a rectangular parallelepiped shape or a substantially rectangular parallelepiped shape, for example. The balun 100 is a multilayer body in which a plurality of dielectric layers are stacked in a stacking direction (Z-axis direction). A bottom surface BF and a top surface UF are perpendicular or substantially perpendicular to the Z-axis direction. Side surfaces F31 and F33 are parallel or substantially parallel to a ZX plane among planes parallel or substantially parallel to the stacking direction. Side surfaces F32 and F34 are parallel or substantially parallel to a YZ plane among planes parallel or substantially parallel to the stacking direction. The terminals P1 and P2 and a ground terminal G43 are provided on the top surface UF, the side surface F33, and the bottom surface BF. Ground terminals G41 and G42 and the terminal P3 are provided on the top surface UF, the side surface F31, and the bottom surface BF. A direction identifying mark DM that identifies the mounting direction of the balun 100 is provided on the top surface UF. The bottom surface BF is electrically connected to a substrate, which is not shown.

Figure 3:
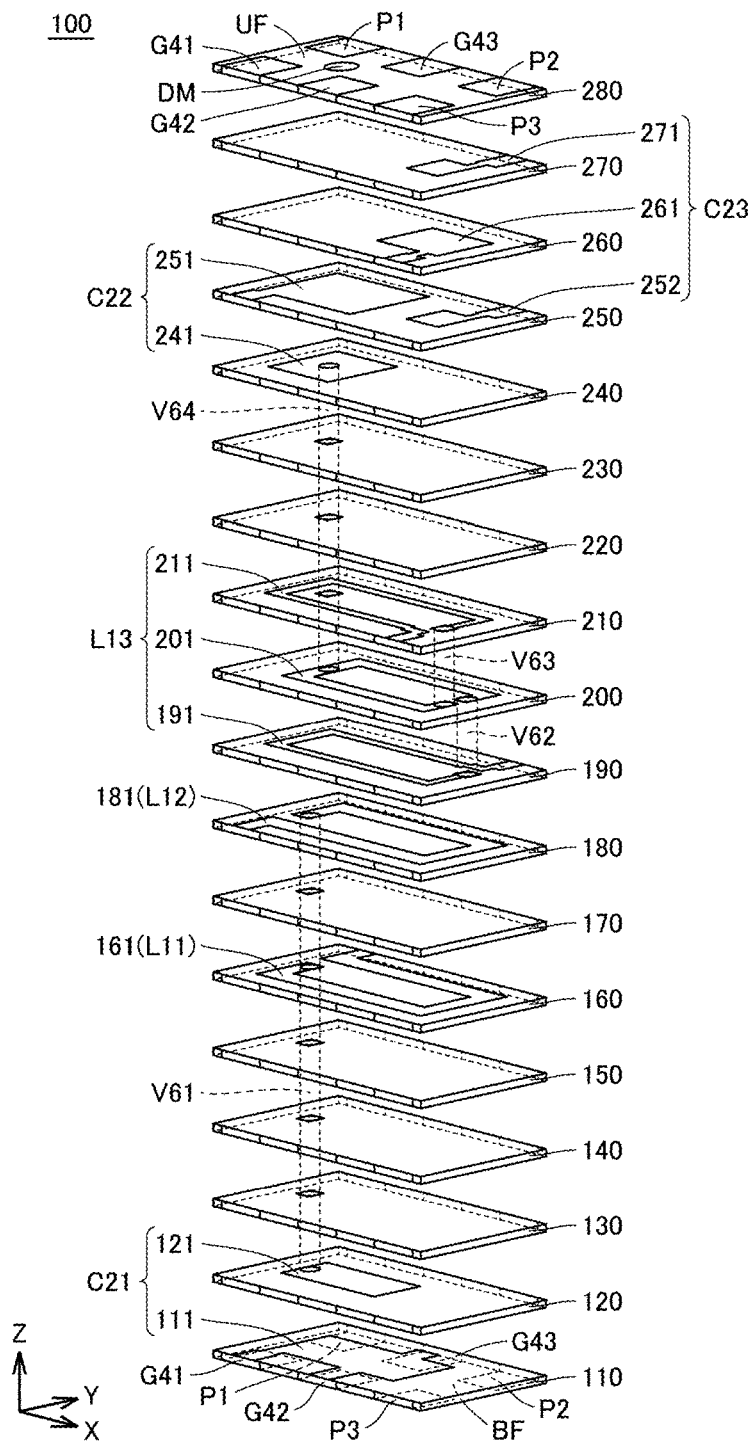
FIG. 3 is an exploded perspective view showing an example of the multilayer structure of the balun in FIG. 1.

FIG. 3 is an exploded perspective view showing an example of the multilayer structure of the balun 100 in FIG. 1. Hereafter, the conductor patterns provided on the dielectric layers will be described while mainly referring to FIG. 3 and while referring to FIG. 1 (equivalent circuit diagram) as necessary.

As shown in FIG. 3, a dielectric layer 110 includes the bottom surface BF. A capacitor conductor pattern 111 is provided on the dielectric layer 110. The capacitor conductor pattern 111 is electrically connected to the ground terminals G41 and G42. A capacitor conductor pattern 121 is provided on a dielectric layer 120. The capacitor conductor patterns 111 and 121 define the capacitor C21 (refer to FIG. 1).

Dielectric layers 130, 140, and 150 are arranged between the dielectric layer 120 and a dielectric layer 160. An inductor conductor pattern 161 is provided on the dielectric layer 160. The inductor conductor pattern 161 is electrically connected to the terminal P1. The inductor conductor pattern 161 defines the inductor L11 (refer to FIG. 1). The inductor conductor pattern 161 is electrically connected to the capacitor conductor pattern 121 by a via conductor pattern V61.

A dielectric layer 170 is arranged between dielectric layers 160 and 180. An inductor conductor pattern 181 is provided on the dielectric layer 180. The inductor conductor pattern 181 is electrically connected to the ground terminal G41. The inductor conductor pattern 181 defines the inductor L12 (refer to FIG. 1). The inductor conductor pattern 181 is electrically connected to the inductor conductor pattern 161 by the via conductor pattern V61.

An inductor conductor pattern 191 is provided on a dielectric layer 190. The inductor conductor pattern 191 is electrically connected to the terminal P2. An inductor conductor pattern 201 is provided on a dielectric layer 200. The inductor conductor pattern 201 is electrically connected to the inductor conductor pattern 191 by a via conductor pattern V62. An inductor conductor pattern 211 is provided on a dielectric layer 210. The inductor conductor pattern 211 is electrically connected to the terminal P3. The inductor conductor pattern 211 is electrically connected to the inductor conductor pattern 201 by a via conductor pattern V63. The inductor conductor patterns 191, 201, and 211 define the inductor L13 (refer to FIG. 1).

Dielectric layers 220 and 230 are arranged between the dielectric layers 210 and 240. A capacitor conductor pattern 241 is provided on the dielectric layer 240. The capacitor conductor pattern 241 is electrically connected to the inductor conductor pattern 201 by a via conductor pattern V64. Capacitor conductor patterns 251 and 252 are provided on a dielectric layer 250. The capacitor conductor pattern 251 is electrically connected to the ground terminal G41. The capacitor conductor patterns 241 and 251 define the capacitor C22 (refer to FIG. 1). The capacitor conductor pattern 252 is electrically connected to the terminal P2.

A capacitor conductor pattern 261 is provided on a dielectric layer 260. The capacitor conductor pattern 261 is electrically connected to the terminal P3. A capacitor conductor pattern 271 is provided on a dielectric layer 270. The capacitor conductor pattern 271 is electrically connected to the terminal P2. The capacitor conductor patterns 252, 261, and 271 define the capacitor C23 (refer to FIG. 1). A dielectric layer 280 includes the top surface UF.

In the balun 100, an inductor layer (dielectric layer 180) on which the inductor L12 is provided is arranged between an inductor layer (dielectric layer 160) on which the inductor L11 is provided, and inductor layers (dielectric layers 190 to 210) on which the inductor L13 is provided. In the balun 100, the inductor L12 of the LC parallel resonator is closer to the inductor L13, which is electrically connected to the balanced signal terminals P2 and P3, than the inductor L11 of the low pass filter in the stacking direction.

Figure 4:
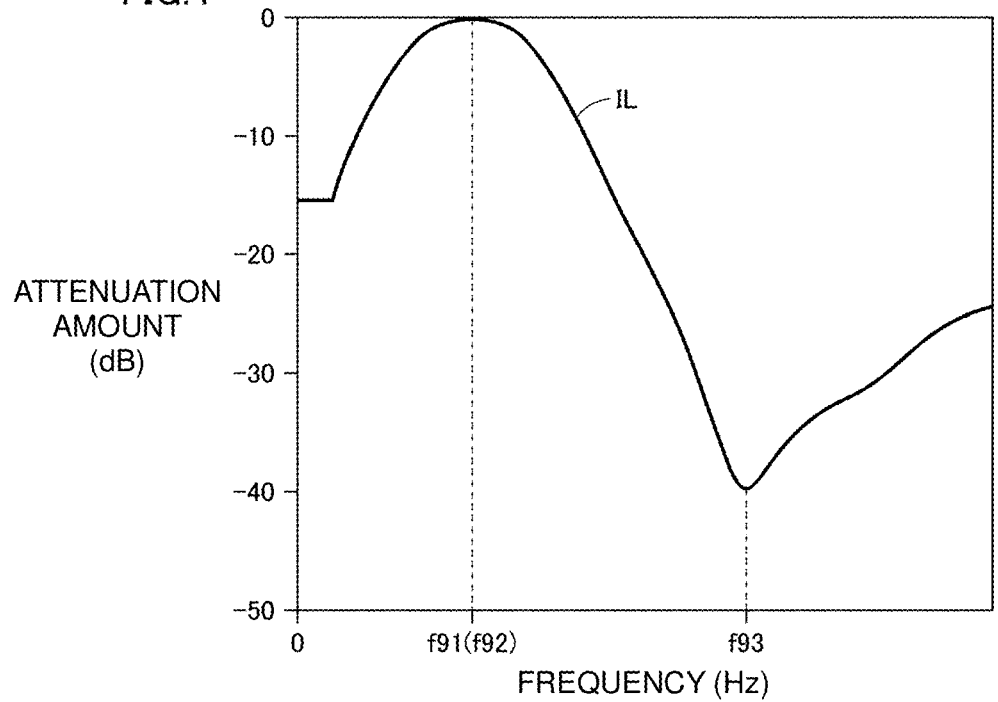
FIG. 4 is a diagram showing the insertion loss of the balun in FIG. 3.

FIG. 4 is a diagram showing insertion loss IL of the balun 100 in FIG. 3. The attenuation amount (dB) on the vertical axis in FIG. 4 is expressed as negative values. The insertion loss increases as the absolute value of the attenuation amount increases. Insertion loss is a parameter representing the proportion of a signal, out of a signal input to a certain terminal of an electronic component, that is transmitted to the other terminal of the electronic component. Accordingly, the proportion of the signal that is lost inside the electronic component out of the signal input to the electronic component increases as the insertion loss increases.

The insertion loss IL represents the proportion of a signal that is transmitted to the terminal P2 out of a signal that is input to the terminal P1. The proportion of a signal that is transmitted to the terminal P3 out of the signal input to the terminal P1 also changes similar to the insertion loss IL.

In the frequency band shown in FIG. 4, the insertion loss IL is substantially minimum in a vicinity of the frequency f91 (f92). In addition, the insertion loss IL is substantially maximum in a vicinity of a frequency f93 (> f91). This is because a harmonic wave in a vicinity of the frequency f93 is attenuated by the low pass filter defined by the inductor L11 and the capacitor C21.

Figure 5:
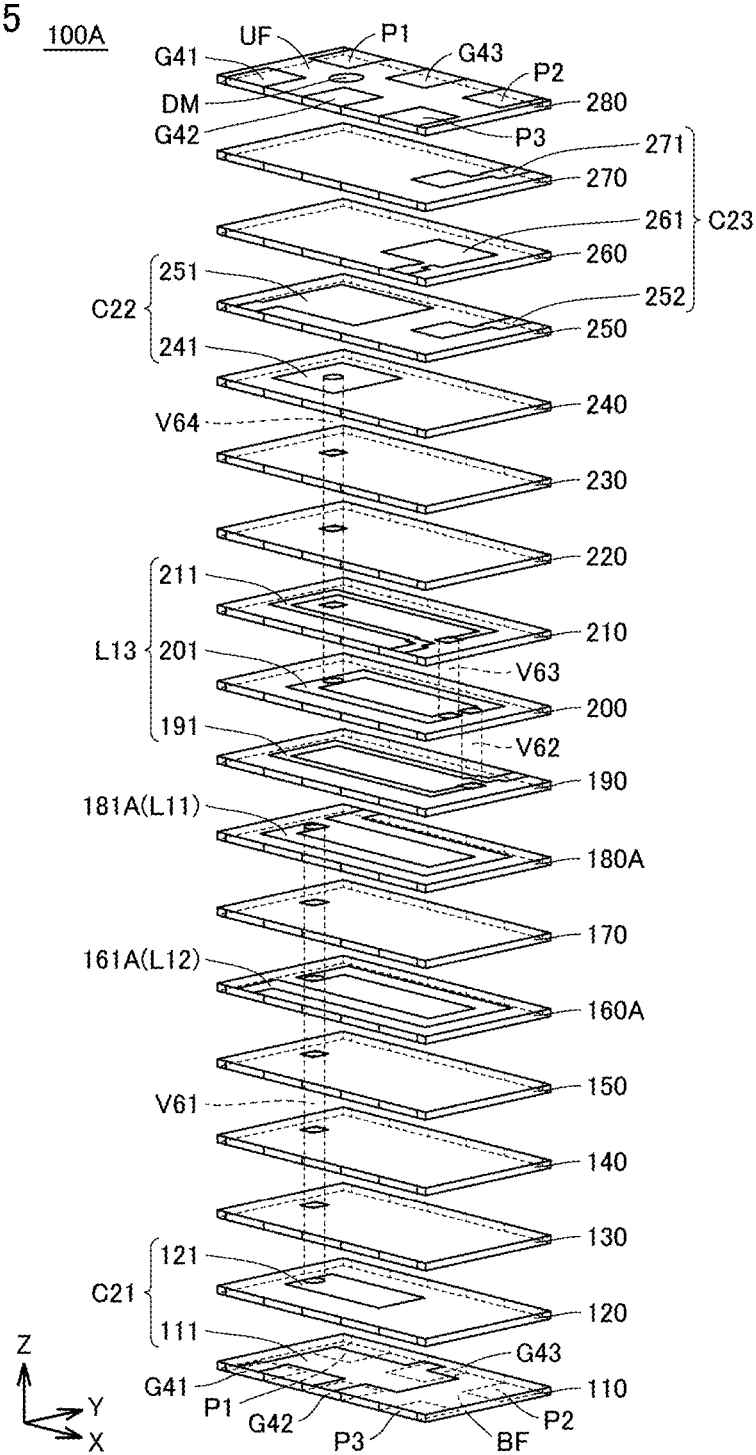
FIG. 5 is an exploded perspective view showing an example of the multilayer structure of a balun according to a modification of a preferred embodiment of the present invention.

FIG. 5 is an exploded perspective view showing an example of the multilayer structure of a balun 100A according to a modification of a preferred embodiment. The multilayer structure of the balun 100A is provided by interchanging the dielectric layers 160 and 180 of the balun 100 shown in FIG. 3. The dielectric layers 160 and 180 in FIG. 3 respectively correspond to dielectric layers 180A and 160A in FIG. 5. The dielectric layers other than the dielectric layers 160A and 180A in FIG. 5 are the same or substantially the same as the dielectric layers in FIG. 3, and therefore description thereof is not repeated.

As shown in FIG. 5, an inductor layer (dielectric layer 180A) on which the inductor L11 is provided is arranged between an inductor layer (dielectric layer 160A) on which the inductor L12 is provided and inductor layers (dielectric layers 190 to 210) on which the inductor L13 is provided. In the balun 100A, the inductor L11 of the low pass filter is closer to the inductor L13, which is electrically connected to the balanced signal terminals P2 and P3 than the inductor L12 of the LC parallel resonator in the stacking direction.

As described above, according to the baluns of preferred embodiments and modifications thereof, insertion loss can be significantly improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A balun comprising:
   a first terminal to receive an unbalanced signal;
   second and third terminals to receive balanced signals;
   first and second inductors that are electrically connected in series with each other between the first terminal and a ground point;
   a first capacitor that is electrically connected in series with the first inductor between the first terminal and the ground point and that is electrically connected in parallel with the second inductor between the first inductor and the ground point; and
   a third inductor that is electrically connected between the second terminal and the third terminal; wherein
   the third inductor is magnetically coupled with the first and second inductors.

2. The balun according to claim 1, further comprising a third capacitor that is electrically connected between a middle portion located between two end portions of the third inductor and the ground point.

3. The balun according to claim 1, wherein
   the balun is a multilayer body including a plurality of dielectric layers that are stacked;
   the plurality of dielectric layers include a first inductor layer on which the first inductor is provided, a second inductor layer on which the second inductor is provided, and a third inductor layer on which the third inductor is provided; and
   the second inductor layer is located between the first inductor layer and the third inductor layer.

4. The balun according to claim 3, further comprising:
   a second capacitor that is electrically connected in parallel with the third inductor; wherein
   the first capacitor and the second capacitor are defined by capacitor conductor patterns provided on at least two layers of the plurality of dielectric layers.

5. The balun according to claim 1, wherein
   the balun is a multilayer body including a plurality of dielectric layers that are stacked;
   the plurality of dielectric layers include a first inductor layer on which the first inductor is provided, a second inductor layer on which the second inductor is provided, and a third inductor layer on which the third inductor is provided; and
   the first inductor layer is located between the second inductor layer and the third inductor layer.

6. The balun according to claim 1, wherein the balun has a rectangular parallelepiped shape or a substantially rectangular parallelepiped shape.

7. The balun according to claim 1, further comprising at least one ground terminal that is electrically connected to the ground point.

8. The balun according to claim 1, wherein
   the first terminal is connected to an antenna; and
   the second and third terminals are connected to an RF circuit.

9. The balun according to claim 1, further comprising:
   a second capacitor that is electrically connected in parallel with the third inductor; wherein
   the first capacitor and the first inductor define a low-pass filter;
   the first capacitor and the second inductor define a first LC parallel resonator; and the second capacitor and the third inductor define a second LC parallel resonator.

10. A balun comprising:
a first terminal to receive an unbalanced signal;
second and third terminals to receive balanced signals;
first and second inductors that are electrically connected in series with each other between the first terminal and a ground point;
a first capacitor that is electrically connected in series with the first inductor between the first terminal and the ground point and that is electrically connected in parallel with the second inductor between the first inductor and the ground point; and
a third inductor that is electrically connected between the second terminal and the third terminal; wherein
the balun is a multilayer body including a plurality of dielectric layers that are stacked;
the plurality of dielectric layers includes a first inductor layer on which the first inductor is provided, a second inductor layer on which the second inductor is provided, and a third inductor layer on which the third inductor is provided; and
the second inductor layer is located between the first inductor layer and the third inductor layer.

11. The balun according to claim 10, further comprising a third capacitor that is electrically connected between a middle portion located between two end portions of the third inductor and the ground point.

12. The balun according to claim 10, wherein the balun has a rectangular parallelepiped shape or a substantially rectangular parallelepiped shape.

13. The balun according to claim 10, further comprising at least one ground terminal that is electrically connected to the ground point.

14. The balun according to claim 10, wherein
the first terminal is connected to an antenna; and
the second and third terminals are connected to an RF circuit.

15. The balun according to claim 10, further comprising:
a second capacitor that is electrically connected in parallel with the third inductor; wherein
the first capacitor and the second capacitor are defined by capacitor conductor patterns provided on at least two layers of the plurality of dielectric layers.

16. The balun according to claim 10, further comprising:
a second capacitor that is electrically connected in parallel with the third inductor; wherein
the first capacitor and the first inductor define a low-pass filter;
the first capacitor and the second inductor define a first LC parallel resonator; and
the second capacitor and the third inductor define a second LC parallel resonator.

17. A balun comprising:
a first terminal to receive an unbalanced signal;
second and third terminals to receive balanced signals;
first and second inductors that are electrically connected in series with each other between the first terminal and a ground point;
a first capacitor that is electrically connected in series with the first inductor between the first terminal and the ground point and that is electrically connected in parallel with the second inductor between the first inductor and the ground point; and
a third inductor that is electrically connected between the second terminal and the third terminal; wherein
the third inductor is magnetically coupled with at least the first inductor;
the balun is a multilayer body including a plurality of dielectric layers that are stacked;
the plurality of dielectric layers include a first inductor layer on which the first inductor is provided, a second inductor layer on which the second inductor is provided, and a third inductor layer on which the third inductor is provided; and
the first inductor layer is located between the second inductor layer and the third inductor layer.

18. A balun comprising:
a first terminal to receive an unbalanced signal;
second and third terminals to receive balanced signals;
first and second inductors that are electrically connected in series with each other between the first terminal and a ground point;
a first capacitor that is electrically connected in series with the first inductor between the first terminal and the ground point and that is electrically connected in parallel with the second inductor between the first inductor and the ground point; and
a third inductor that is electrically connected between the second terminal and the third terminal; wherein
the third inductor is magnetically coupled with at least the first inductor;
the balun is a multilayer body including a plurality of dielectric layers that are stacked;
the plurality of dielectric layers include a first inductor layer on which the first inductor is provided, a second inductor layer on which the second inductor is provided, and a third inductor layer on which the third inductor is provided; and
the second inductor layer is located between the first inductor layer and the third inductor layer.

* * * * *